United States Patent
Terashima

[11] Patent Number: 5,907,182
[45] Date of Patent: *May 25, 1999

[54] SEMICONDUCTOR DEVICE HAVING ELEMENT WITH HIGH BREAKDOWN VOLTAGE

[75] Inventor: Tomohide Terashima, Hyogo, Japan

[73] Assignee: Mitsubishi Denki Kabushiki Kaisha, Tokyo, Japan

[*] Notice: This patent is subject to a terminal disclaimer.

[21] Appl. No.: 08/975,290

[22] Filed: Nov. 20, 1997

Related U.S. Application Data

[63] Continuation of application No. 08/701,291, Aug. 22, 1996, Pat. No. 5,731,628.

[30] Foreign Application Priority Data

Jun. 21, 1996 [JP] Japan .................................. 8-161620

[51] Int. Cl.$^6$ .................................................. H01L 23/58
[52] U.S. Cl. ...................... 257/637; 257/641; 257/642; 257/644; 257/645; 257/650
[58] Field of Search ..................................... 257/637, 641, 257/642, 644, 645, 650

[56] References Cited

U.S. PATENT DOCUMENTS

| | | |
|---|---|---|
| 4,601,939 | 7/1986 | Gati et al. . |
| 5,061,985 | 10/1991 | Meghrr et al. . |
| 5,109,267 | 4/1992 | Kobbinger et al. . |
| 5,439,849 | 8/1995 | McBride et al. . |
| 5,592,024 | 1/1997 | Aoyama et al. . |
| 5,731,628 | 3/1998 | Terashima .............................. 257/637 |

FOREIGN PATENT DOCUMENTS

| | | |
|---|---|---|
| 0 275 588 | 7/1988 | European Pat. Off. . |
| 54-077578 | 6/1979 | Japan . |
| 59-181022 | 10/1984 | Japan . |

OTHER PUBLICATIONS

S.M. Sze, *VLSI Technology*, 2nd ed., New York: McGraw–Hill Book Co., 1988, pp. 261, 262.

*Primary Examiner*—Ngân Van Ngô
*Attorney, Agent, or Firm*—McDermott, Will & Emery

[57] ABSTRACT

A semiconductor device which contains an electrode or an interconnection subjected to a high voltage prevents current leakage due to polarization of a mold resin. In this semiconductor device, a glass coat film 13a covering a semiconductor element has an electrical conductivity in a range defined by the following formula (1) under the conditions of temperature between 17° C. and 145° C.:

$$\text{conductivity} \geq 1 \times 10^{-10}/E \qquad (1)$$

(E: an electric field intensity [V/cm], $E \geq 2 \times 10^4$ [V/cm])
Owing to employment of the electrically conductive glass coat film, an electron current flowing through the conductive glass coat film suppresses an electric field caused by polarization of a mold resin.

12 Claims, 8 Drawing Sheets

5,907,182

SEMICONDUCTOR DEVICE HAVING ELEMENT WITH HIGH BREAKDOWN VOLTAGE

This application is a continuation of application Ser. No. 08/701,291 filed Aug. 22, 1996, now U.S. Pat. No. 5,731,628.

BACKGROUND OF THE INVENTION

1. Field of the Invention

The present invention relates to a semiconductor device, and particularly to a semiconductor device having an IC (Integrated Circuit) with a high breakdown voltage.

2. Description of the Background Art

FIG. 13 is a cross section showing a structure of a semiconductor device having an IC with a high breakdown voltage in the prior art. Referring to FIG. 13, a p-type semiconductor substrate 1 has a main surface, at which field oxide films 10 for element isolation are formed with a predetermined space therebetween. An n⁻ diffusion region 2 is formed at a predetermined region in the main surface of p-type semiconductor substrate 1. The n⁻ diffusion region 2 forms a well region. There are formed p-type diffusion regions 5 and 6 at the surface of n⁻ diffusion region 2 so as to be spaced by a predetermined distance with a channel region therebetween. The p-type diffusion regions 5 and 6 form source/drain regions. On the channel region, a gate electrode 8 made of a polycrystalline silicon film is formed with a gate insulating film therebetween. The p-type diffusion regions 5 and 6 as well as gate electrode 8 form a p-channel MOS transistor. At a portion spaced from this p-channel MOS transistor by field oxide film 10, there are formed a pair of n-type diffusion regions 3 and 4 which are spaced from each other by a predetermined distance to locate a channel region therebetween. On the channel region between n-type diffusion regions 3 and 4, there is formed a gate electrode 9 made of a polycrystalline silicon film with a gate insulating film therebetween. The n-type diffusion regions 3 and 4 as well as gate electrode 9 form an n-channel MOS transistor. A p⁺ diffusion region 7 is formed under field oxide film 10 which is located between p-type diffusion region 6 and n-type diffusion region 3.

Field oxide film 10 and gate electrodes 8 and 9 are covered with a passivation film 12 for element protection. Contact holes are formed at regions in passivation film 12 corresponding to n-type diffusion regions 3 and 4 and p-type diffusion regions 5 and 6, respectively. There are formed source/drain electrodes which are connected to n-type diffusion regions 3 and 4 and p-type diffusion regions 5 and 6 through these contact holes, respectively. Aluminum electrodes 11 and 15 are formed at predetermined regions on passivation film 12. Aluminum electrode 15 has a potential substantially equal to that on p-type semiconductor substrate 1. Since an IC with a high breakdown voltage is subjected to a high voltage input, an aluminum electrode such as aluminum electrode 11 which attains a high voltage essentially exists in the IC.

A glass coat film 13b is formed over the source/drain regions, aluminum electrodes 11 and 15, and passivation film 12. A mold resin 14 is formed over glass coat film 13b.

When a high input voltage is applied to aluminum electrode 11, an electric field caused by aluminum electrode 11 is small in a room temperature, and this electric field does not significantly affect the n- and p-channel MOS transistors.

In a high temperature, however, aluminum electrode 11 subjected to a high voltage causes a strong electric field, so that p⁺ diffusion region 7 is inverted into the n-type, and a parasitic transistor formed of n⁻ diffusion region 2 and n-type diffusion region 3 is turned on as shown in FIG. 14. Consequently, a leakage current flows in the circuit formed of n- and p-channel MOS transistors which are elements having low breakdown voltages. FIG. 15 schematically shows an equivalent capacitor model along the electric field shown in FIG. 14. Referring to FIG. 15, C1 indicates a capacitance of glass coat film 13b, Cm indicates a capacitance of the mold resin, C2 indicates a total capacitance of field oxide film 10, passivation film 12 and glass coat film 13b. When a voltage (V) is applied to aluminum electrode 11, the voltage is shared in accordance with the capacities of the respective capacitors. A voltage (V2) applied across p-type semiconductor substrate 1 and mold resin 14 is expressed by the following formula (2):

$$V2 = V \cdot C1/(C1 + C2 + C1 \cdot C2/Cm) \quad (2)$$

Referring to formula (2), when Cm is sufficiently small, a relationship of (V2<<V) is established. However, mold resin 14 generally has such a property that polarization occurs due to movement of movable ions contained in the resin when an electric field is applied thereto in a high temperature. This polarization of mold resin 14 increases Cm, and hence raises V2. Raised V2 promotes inversion of p⁺ diffusion region 7 into n-type as shown in FIG. 14, so that the parasitic MOS transistor is turned on, and the current leakage becomes more liable to occur. The quantity of electric charges, which are accumulated in C2 when p⁺ diffusion region 7 is inverted into the n-type, can be calculated from a field inversion voltage (Vtf) and a capacitance (C) of field oxide film 10 by $(Q = C2 \cdot V2 = C \cdot Vtf)$, and is generally from $1 \times 10^1$ to $1 \times 10^{12}$ [cm⁻²]. The quantity of electric charges accumulated in C2 is considerably small when the density of mold resin 14 is taken into consideration, and is sufficiently attainable by polarization of mold resin 14. This means that it is difficult to stabilize V2 by improving mold resin 14 itself.

In theory, movable ions contained in mold resin 14 do not stop moving until the electric field disappears in mold resin 14. Therefore, the current leakage due to polarization of mold resin 14 is extremely likely to occur, when IC contains a pole at a voltage higher than V2 which is applied when p⁺ diffusion region 7 is inverted into n-type. In the structure of the conventional semiconductor device containing the IC with a high breakdown voltage, as described above, it is difficult to prevent polarization of mold resin 14 if aluminum electrode 11 subjected to a high voltage exists in the IC.

SUMMARY OF THE INVENTION

An object of the invention is to provide a semiconductor device which can effectively prevent current leakage due to polarization of a mold resin.

Another object of the invention is to provide a semiconductor device which can prevent polarization of a mold resin in an IC containing an electrode subjected to a high voltage.

According to an aspect of the invention, a semiconductor device includes a semiconductor region, a semiconductor element, a glass coat film and a mold resin. The semiconductor region has a main surface, and the semiconductor element is formed at the main surface of the semiconductor region. The glass coat film covers the semiconductor element. The mold resin is formed on the glass coat film. The glass coat film includes a first glass coat film having an electrical conductivity in a range defined by the following formula (1) under the conditions of temperature between 17° C. and 145° C.:

$$\text{conductivity} \geq 1 \times 10^{-10}/E \quad (1)$$

(E: an electric field intensity [V/cm], $E \geq 2 \times 10^4$ [V/cm])
According to the semiconductor device of the above aspect, by employing the conductive first glass coat film having a conductivity in the above range, it is possible to suppress effectively application of a high electric field due to polarization of the mold resin in the semiconductor device containing an electrode subjected to a high voltage. Thereby, it is possible to prevent disadvantageous current leakage due to turn-on of a parasitic transistor by such a high electric field.

A semiconductor device according to another aspect of the invention includes a semiconductor region, a semiconductor element, a glass coat film and a mold resin, similarly to the above aspect. In this semiconductor device, the glass coat film includes a nitride film having a refractivity of 2.05 or more. Owing to this structure, the glass coat film has an electrical conductivity, and consequently it is possible to suppress effectively disadvantageous current leakage due to polarization of the mold resin in the semiconductor device containing an electrode subjected to a high voltage.

According to still another aspect of the invention, a semiconductor device includes a semiconductor region, an element isolating and insulating film, a pair of source/drain regions, a gate electrode, an impurity region, a glass coat film and a mold resin. The element isolating and insulating film is formed at the main surface of the semiconductor region. The paired source/drain regions are formed at regions in the main surface of the semiconductor region adjacent to the element isolating and insulating film, and are spaced from each other to define a channel region therebetween. The gate electrode is formed on the channel region with a gate insulating film therebetween. The impurity region is formed under the element isolating and insulating film, and has the same conductivity type as the source/drain regions. The glass coat film covers the gate electrode and the element isolating and insulating film. The mold resin is formed on the glass coat film. The glass coat film includes a first glass coat film having an electrical conductivity in a range defined by the following formula (1) under the conditions of temperature between 17° C. and 145° C.:

$$\text{conductivity} \geq 1 \times 10^{-10}/E \quad (1)$$

(E: an electric field intensity [V/cm], $E \geq 2 \times 10^4$ [V/cm])
According to the semiconductor device of the above aspect, by employing the conductive first glass coat film having a conductivity in the above range, it is possible, in the structure containing an electrode subjected to a high voltage, to prevent disadvantageous current leakage due to inversion of the impurity region, which is caused by a high electric field due to polarization of the mold resin.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Embodiment 1)

Figure 1:
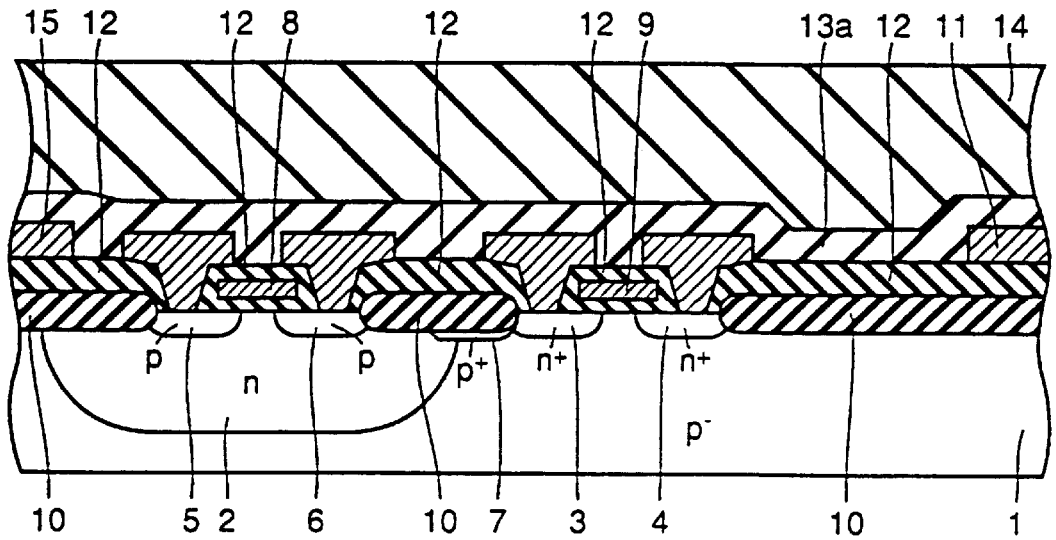
FIG. 1 is a cross section showing an IC having a high breakdown voltage according to an embodiment 1 of the invention.

Referring to FIGS. 1 to 5, an embodiment 1 will be described below. Referring first to FIG. 1, an IC having a high breakdown voltage according to the embodiment 1 includes a p-type semiconductor substrate 1 having a main surface. Field oxide films 10 for element isolation are formed at the main surface with a predetermined space from each other. An $n^-$ diffusion region 2 forming an n-well is formed at the main surface of p-type semiconductor substrate 1. p-type diffusion regions 5 and 6 which are spaced by a predetermined distance to locate a channel region therebetween is formed at the main surface of $n^-$ diffusion region 2. A gate electrode 8 made of a polycrystalline silicon film is formed on the channel region with a gate insulating film therebetween. Gate electrode 8 and p-type diffusion regions 5 and 6 form a p-channel MOS transistor.

At positions each spaced from the channel region by p-type diffusion region 6 and field oxide film 10, there are formed n-type diffusion regions 3 and 4, which are spaced from each other to locate a channel region therebetween. On this channel region, a gate electrode 9 made of a polycrystalline silicon film is formed with a gate insulating film therebetween. Gate electrode 9 and n-type diffusion regions 3 and 4 form an n-channel MOS transistor. These n- and p-channel MOS transistors form a CMOS region. A passivation film 12 serving as an element protection film covers field oxide films 10, n-type diffusion regions 3 and 4, p-type diffusion regions 5 and 6, and gate electrodes 8 and 9. Passivation film 12 is provided at positions above n- and p-type diffusion regions 3, 4, 5 and 6 with contact holes, through which source/drain electrodes are connected to diffusion regions 3–6, respectively.

On field oxide film 10, there are formed an aluminum electrode (aluminum interconnection) 15 carrying the substantially same potential as p-type semiconductor substrate 1 and an aluminum electrode (aluminum interconnection) 11 subjected to a high voltage. A glass coat film 13a having an electrical conductivity covers aluminum electrodes 11 and 15, passivation film 12 and the source/drain electrodes. A mold resin 14 is formed in contact with an upper surface of conductive glass coat film 13a.

The embodiment 1 differs from the prior art in that it employs the conductive glass coat film 13a. Owing to employment of the conductive glass coat film 13a, electrons are accumulated at an interface between conductive glass coat film 13a and mold resin 14, as will be described later, so that it is possible to provide a shielding against the electric field generated by polarization of mold resin 14.

Figure 2:
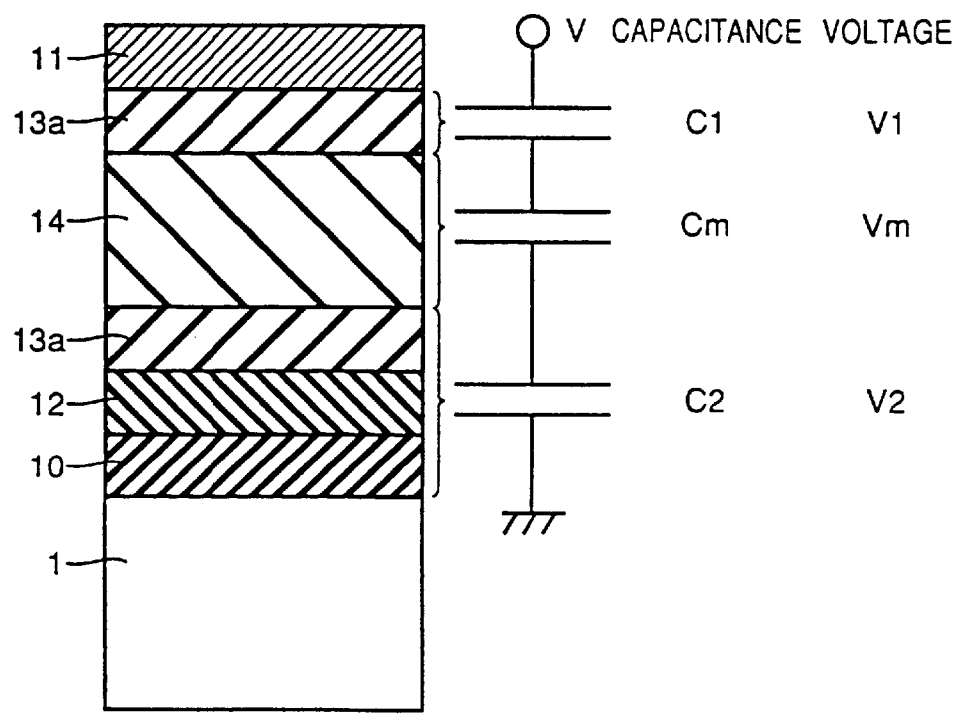
FIG. 2 schematically shows an equivalent capacitor model of the structure shown in FIG. 1.

Referring to FIG. 2 showing an equivalent capacitor model, a capacitance (C1) of glass coat film 13a, a capacitance (Cm) of mold resin 14 and a total capacitance (C2) of field oxide film 10, passivation film 12 and glass coat film 13a are connected in serial. When a voltage (V) is applied to aluminum electrode 11, the voltage is shared in accordance with capacities of the capacitors.

Figure 3:
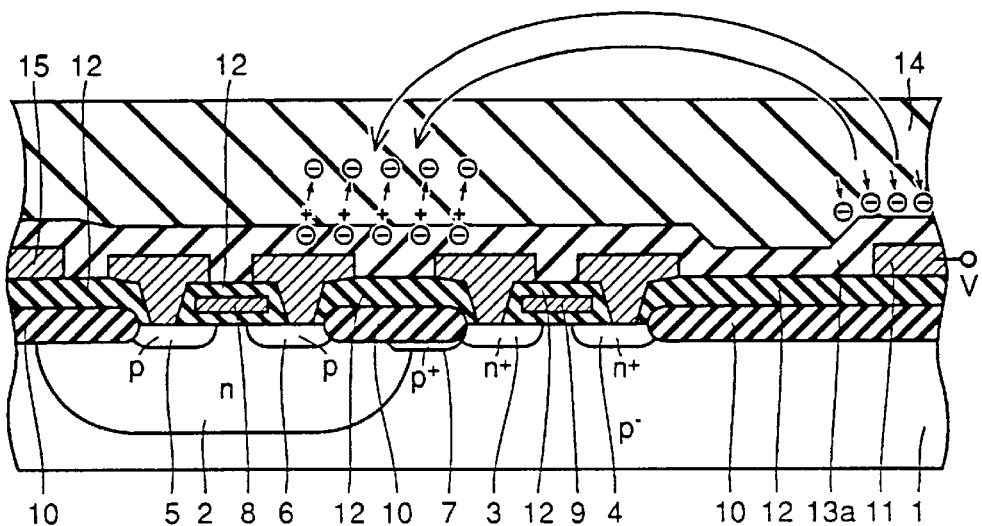
FIG. 3 is a cross section showing an electric field generated in the structure shown in FIG. 1.

In the structure of the embodiment 1, an electric field appears as shown in FIG. 3, when aluminum electrode 11 attains a high potential. Since glass coat film 13a is an insulating film having an electrical conductivity, the electric field inside glass coat film 13a can be reduced by static electrification of glass coat film 13a itself. However, this means decrease in (V1) shown in FIG. 2, so that (Vm) and (V2) rather increase. Even in the structure of the embodiment 1, therefore, it is difficult to provide a shielding against the electric field at the portion of (C1).

Meanwhile, the following effect can be achieved at the region of capacitance (C2). Regardless of whether mold resin 14 is polarized or not, a vertical electric field exists at the CMOS region. A drift electron current generated by this electric field flows from aluminum electrode 15 and source/drain electrodes toward mold resin 14, so that electrons are accumulated at the interface between glass coat film 13a and mold resin 14. This achieves an effect of providing a shielding against the electric field. Since the voltage at aluminum electrode 15 in the CMOS region is substantially equal to the CMOS power supply voltage at the most, aluminum electrode 15 supplies electrons toward a region carrying a voltage higher than the CMOS power supply voltage, so that the voltage at the interface between mold resin 14 and glass coat film 13a at an upper portion of the CMOS region is ultimately reduced to or below the CMOS power supply voltage. Since the field inversion voltage (Vtf) at the CMOS region is designed not to be inverted with the CMOS power supply voltage, current leakage can be effectively suppressed by restricting the voltage at the interface between mold resin 14 and glass coat film 13a to or below the CMOS power supply voltage as described above. It is significantly advantageous that this effect follows polarization of mold resin 14.

For lateral current flow from aluminum interconnection 15 to glass coat film 13a, such conditions are necessary that an electrical conductivity of glass coat film 13a at a low electric field is equal to a certain value or more, and that mold resin 14 has a sufficient electrical conductivity range even at a temperature lower than a temperature starting polarization of mold resin 14. If these conditions are satisfied, a current can flow very stably through glass coat film 13a.

Characteristics satisfying the above conditions will now be quantitatively discussed below. Since field inversion voltage (Vtf) is generally 20 V or more, the vertical electric field at the level of $2 \times 10^5$ [V/cm] is generated by the voltage near field inversion voltage Vtf, when field oxide film 10 has a thickness of 1am. In view of the fact that electrons flow laterally through glass coat film 13a as described above, the conductivity of glass coat film 13a in the electric field from $2 \times 10^4$ to $2 \times 10^5$ [V/cm] is an important factor. The time required for canceling polarization of mold resin 14 depends on a current density and a mobility of a current flowing through glass coat film 13a. In this case, an influence by the mobility can be ignored, when the general mobility of charges in glass coat film 13a is taken into consideration. Therefore, a time for canceling polarization of mold resin 14 is estimated from the current density. Assuming that the current density causing polarization of mold resin 14 is $1 \times 10^{11} - 1 \times 10^{12}$ [1/cm$^2$], a time (t) for canceling polarization is in a range from $1 \times 10^{11}/(1 \times 10^{-10}/q) \approx 160$ [sec] to $1 \times 10^{12}/(1 \times 10^{-10}/q) \approx 1600$ [sec] where q is a quantity of charges of electrons and is $1.6 \times 10^{-19}$ [C], because the current density is $1 \times 10^{-10}$ [A/cm$^2$]. Since leakage by polarization of mold resin 14 is generated in about one hour (3600 seconds), it can be considered that a time of about 160 to about 1600 seconds is allowed for canceling polarization of mold resin 14. Therefore, a required current density is $1 \times 10^{-10}$ [A/cm$^2$] or more. The required conductivity with the current density of $1 \times 10^{-10}$ [A/cm$^2$] and the electric field from $2 \times 10^4$ to $2 \times 10^5$ [V/cm] is in a range from $1 \times 10^{-10}/2 \times 10^4 = 5 \times 10^{-15}$ [1/Ωcm] to $1 \times 10^{-10}/2 \times 10^5 = 5 \times 10^{-16}$ [1/Ωcm].

The following formula (1) can be obtained by replacing the electric field in above range with E:

$$\text{conductivity} \geq 1 \times 10^{-10}/E \quad (1)$$

(E: electric field intensity [V/cm], $E \geq 2 \times 10^4$ [V/cm])

Figure 4:
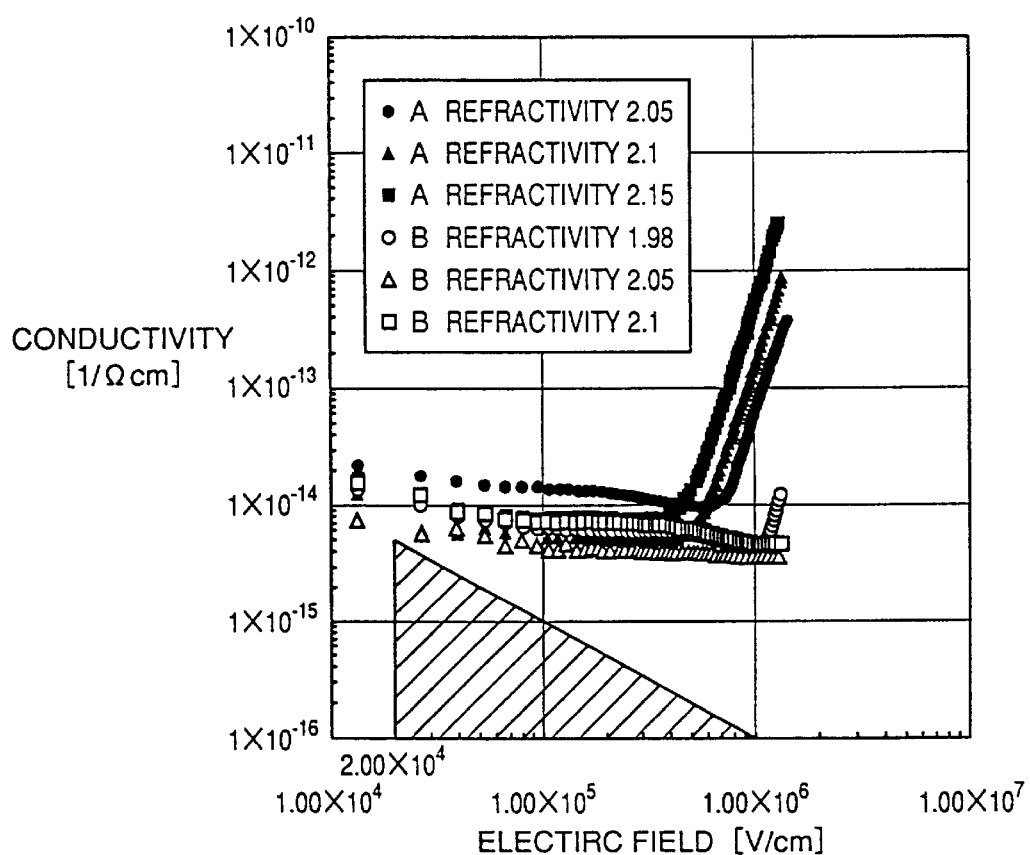
FIG. 4 shows a relationship between an electric field and a conductivity of a plasma nitride film under conditions of temperature at 17° C.
Figure 5:
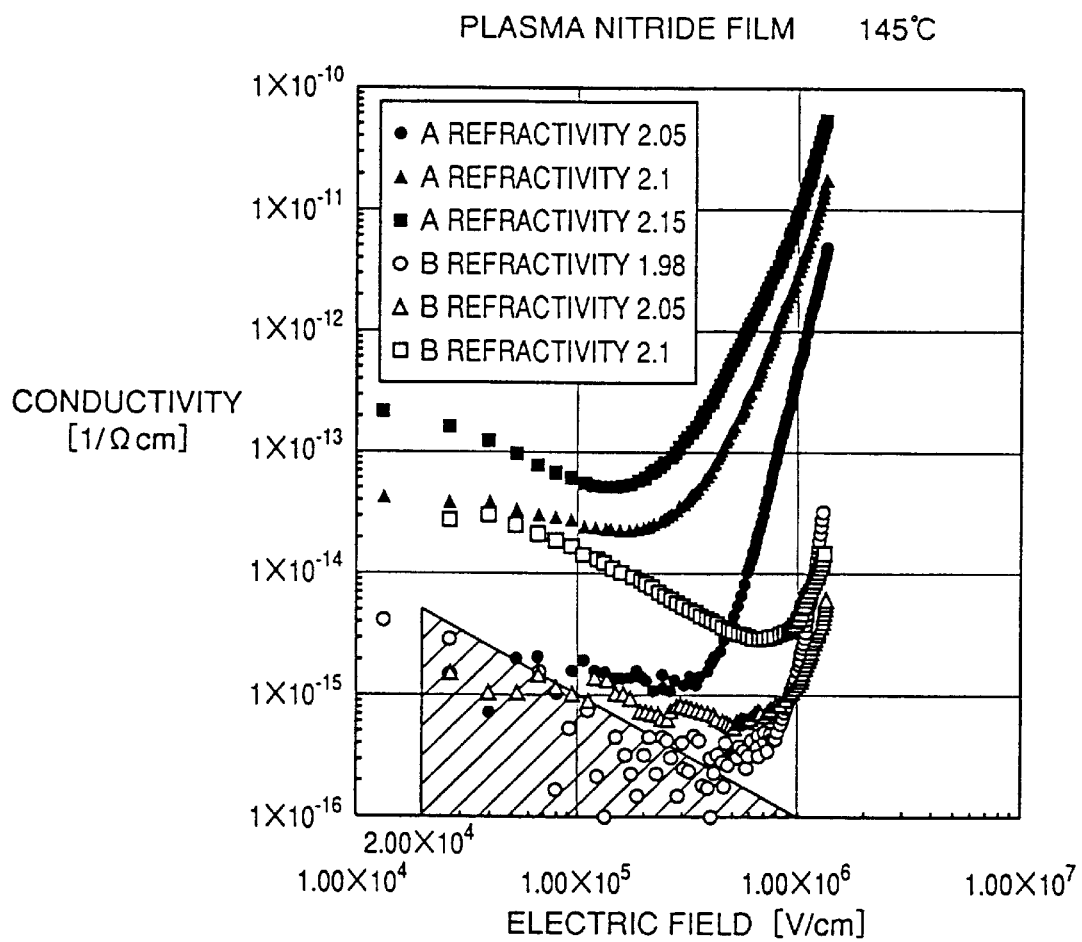
FIG. 5 shows a relationship between an electric field and a conductivity of a plasma nitride film under conditions of temperature at 145° C.

It can be understood that glass coat film 13a satisfying the above formula (1) is required. Data obtained by actually measuring the relationship between the electric field and the conductivity type is shown in FIGS. 4 and 5. Data in FIG. 4 was obtained under the temperature condition at 17° C., and data in FIG. 5 was obtained under the temperature condition of 145° C. Hatched regions shown in 4 and 5 do not satisfy the conditions of the above formula (1). Data in FIGS. 4 and 5 were obtained with glass coat films 13a, which were made of plasma nitride films having refractivities of 1.98, 2.05, 2.10 and 2.15, respectively. A and B in FIGS. 4 and 5 indicate two types of processing devices. From investigation on polarization of mold resin 14 with these samples, it was found that the foregoing current leakage occurred in all the samples when the refractivity is not higher than 2.05. Consequently, a strong correspondence was found between the current leakage and the refractivity. From the foregoing, it can be considered that a strong correspondence exists between the conductivity and the refractivity. This correspondence is clear found at a region in which the electric field is lower than $1 \times 10^5$ [V/cm] under the temperature condition at 145° C. in FIG. 5. In other words, the correspondence does not exist or is inverted in regions other than the above. In view of the facts that mold resin 14 starts polarization at a high temperature, and that the conductivity in the low electric field of $2 \times 10^5$ [V/cm] or less is important, it can be understood from the correspondence between the conductivity and the refractivity under the temperature condition at 145° C. in the electric field of $1 \times 10^5$ [V/cm] or less shown in FIG. 5 that a strong correspondence exists between the refractivity and the current leakage.

It should be noted in the data shown in FIGS. 4 and 5 that temperature dependency of the conductivity in the low electric field is negative when the refractivity is less than 2.05. In other words, the conductivity at a high temperature causing polarization of mold resin 14 is lower than that at a low temperature, if the refractivity is less than 2.05. This means that leakage is liable to occur at a high temperature in a low electric field, if the refractivity is less than 2.05. From the foregoing, the required refractivity is 2.05 or more when the glass coat film 13a is made of a nitride film.

(Embodiment 2)

Figure 6:
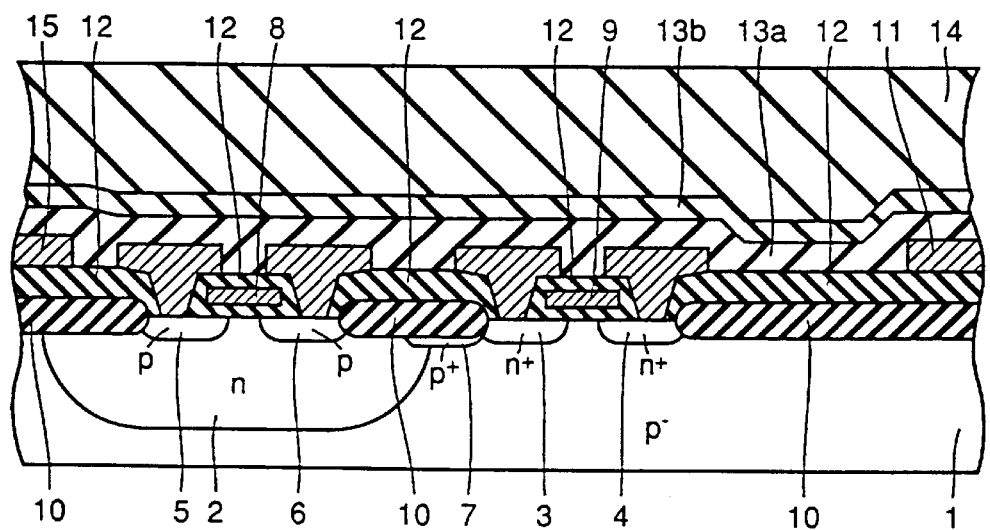
FIG. 6 is a cross section showing an IC having a high breakdown voltage according to an embodiment 2 of the invention.

Referring to FIG. 6, description will be given on a structure of an IC having a high breakdown voltage according to an embodiment 2 of the invention. The IC having a high breakdown voltage of the embodiment 2 has the basically same structure as that of the embodiment 1 shown in FIG. 1. In the structure of the embodiment 2, a conventional glass coat film 13b is additionally arranged between conductive glass coat film 13a and mold resin 14 which are the same as those in the embodiment 1. Glass coat film 13a has a conductivity which satisfies the same conditions as those of the formula (1) in the embodiment 1. The glass coat film 13b uses a normal glass coat film having a high resistance in contrast to glass coat film 13a. In the structure of the embodiment 2, electrical short-circuit can be prevented at a region of the surface of glass coat film 13a even when an electrically conductive material adheres to this region before molding the IC chip. Thereby, such a disadvantage can be prevented that adhesion of an electrically conductive foreign material reduces a resistance between interconnections and thus causes current leakage. According to the embodiment 2, glass coat film 13b having a high resistance is arranged on conductive glass coat film 13a as described above, so that a disadvantage caused by the structure employing only conductive glass coat film 13a can be effectively prevented, and more specifically adverse effect by adhesion of a foreign material to the surface of glass coat film 13a can be effectively prevented.

(Embodiment 3)

Figure 7:
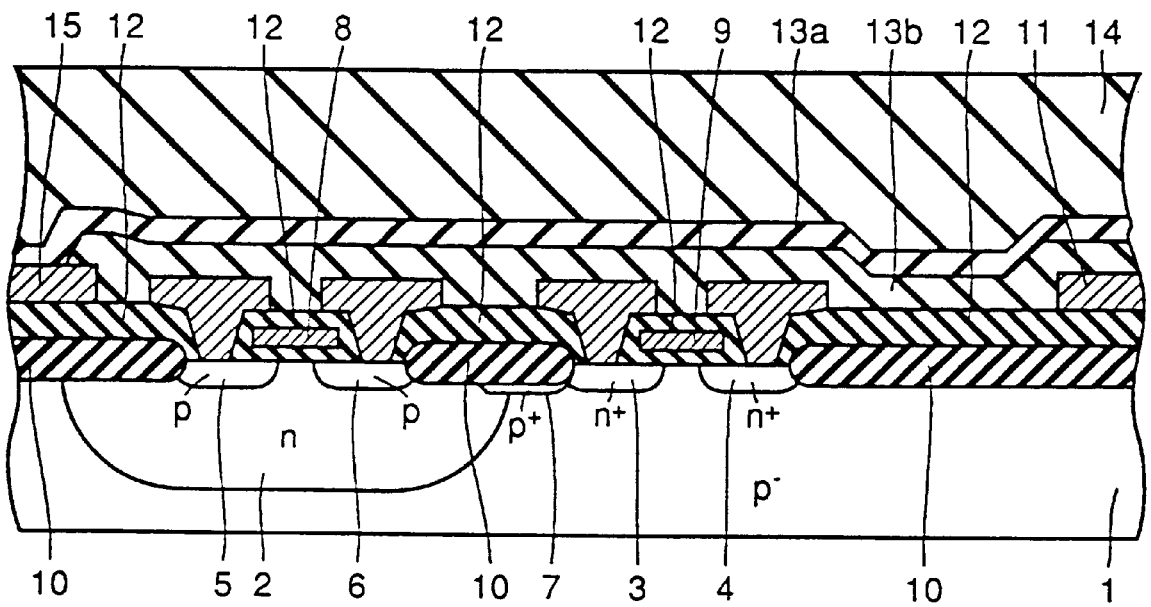
FIG. 7 is a cross section showing an IC having a high breakdown voltage according to an embodiment 3 of the invention.

A structure of an IC having a high breakdown voltage according to an embodiment 3 will be described below with reference to FIG. 7. The embodiment 3 differs from the embodiment 2 shown in FIG. 6 in that glass coat film 13b having a high resistance is disposed under conductive glass coat film 13a, and high-resistance glass coat film 13b covers and is in contact with source/drain electrodes. Conductive glass coat film 13a has a conductivity satisfying the conditions defined by the formula (1). Conductive glass coat film 13a is in contact with only a portion of an upper surface of aluminum interconnection 15 carrying the substantially same potential as p-type semiconductor substrate 1. Other structures are the same as those of the embodiments 1 and 2. In this embodiment 3, since high-resistance glass coat film 13b covers an area between interconnections which is to be spaced or isolated from conductive glass coat film 13a, it is possible to eliminate a possibility of current leakage due to the conductivity of glass coat film 13a. Since aluminum interconnection 15 is in contact with glass coat film 13a, aluminum interconnection 15 supplies charges thereto, which achieve an electric field shielding effect similarly to the embodiment 1. Although not shown, conventional glass coat film 13b having a high resistance may be additionally formed between conductive glass coat film 13a and mold resin 14, whereby it is possible to prevent a disadvantage caused by adhesion of a conductive foreign material onto the surface of the glass coat film, as can be done in the embodiment 2.

(Embodiment 4)

An IC having a high breakdown voltage of an embodiment 4 will now be described below with reference to FIG. 8. The structure of the embodiment 4 is a modification of the contact structure between glass coat film 13a and aluminum interconnection 15 of the embodiment 3 shown in FIG. 7. In this embodiment 4, conventional glass coat film 13b covers the side and upper surfaces of aluminum interconnection 15, and has a first opening above the upper surface of aluminum interconnection 15. Conductive glass coat film 13a is in contact with aluminum interconnection 15 through the first opening in high-resistance glass coat film 13b, and is provided at a position above the upper surface of aluminum interconnection 15 with a second opening smaller than the first opening. According to this structure, it is possible to eliminate a possibility of current leakage due to the conductivity of glass coat film 13a, as can be done in the embodiment 3. Although not shown, conventional glass coat film 13b having a high resistance may be additionally formed over conductive glass coat film 13a, whereby it is possible to prevent a disadvantage caused by adhesion of a foreign material onto the surface of the glass coat film, as can be done in the embodiment 2.

Figure 8:
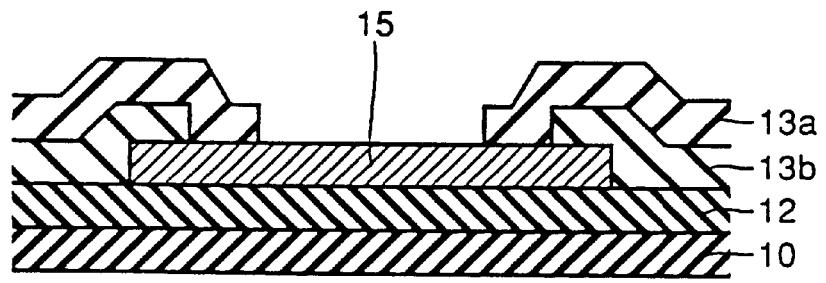
FIG. 8 is a cross section showing an IC having a high breakdown voltage according to an embodiment 4 of the invention.

In a process of manufacturing the structure of the embodiment 4 shown in FIG. 8, a resist having a predetermined configuration is formed after forming glass coat film 13b. Glass coat film 13b is etched with this resist. In this etching, side etching of glass coat film 13b is performed to a higher extent. After removing the resist, glass coat film 13a is deposited, and subsequently another resist is formed with the mask once used for forming the above mask. Conductive glass coat film 13a masked with this resist is etched, in which case the side etch is performed to a relatively small extent. Thereby, the structure shown in FIG. 8 is completed. By this manufacturing process, the structure in FIG. 8 can be formed easily without an additional mask. When aluminum interconnection 15 in FIG. 8 is used as a bonding pad, a possibility of current leakage exists only at an area between adjacent bonding pads. However, a resistance between the adjacent bonding pads is nearly equal to only a sheet resistance of 1 sheet. Therefore, the resistance between the adjacent bonding pads is sufficiently smaller than that (0.01–0.001 sheet resistance) between parallel interconnections in an internal circuit of a conventional structure. Accordingly, the possibility of current leakage between bonding pads is extremely small.

(Embodiment 5)

Figure 9:
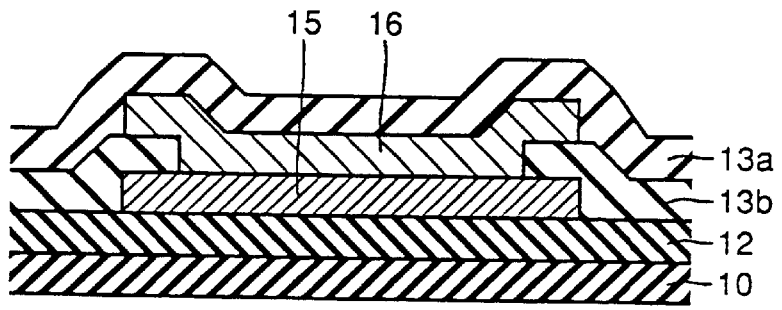
FIG. 9 is a cross section showing an IC having a high breakdown voltage according to an embodiment 5 of the invention.

A structure of an embodiment 5 will be describe below with reference to FIG. 9. The embodiment 5 corresponds to the embodiment 3 but employs a two-aluminum-processed structure for aluminum interconnection 15. As shown in FIG. 9, an aluminum interconnection 16 at a second or upper layer is formed on aluminum interconnection 15. Second aluminum interconnection 16 is in contact with aluminum interconnection 15 through the first opening, which is formed at high-resistance glass coat film 13b and is located on aluminum interconnection 15, and fills the first opening. Second aluminum interconnection 16 has raised ends located on high-resistance glass coat film 13b. Conductive glass coat film 13a is in contact with an upper surface of high-resistance glass coat film 13b and an upper surface of second aluminum interconnection 16. Owing to this structure, conductive glass coat film 13a is in contact with aluminum interconnection 15 via second aluminum interconnection 16. By electrically isolating aluminum interconnections 15 and 16 from other aluminum interconnections at the first level, current leakage can be prevented in the general circuit formed of aluminum interconnection 15 at the first level and the other aluminum interconnections at the first level. Conventional glass coat film 13b having a high resistance may be additionally formed over conductive glass coat film 13a, whereby it is possible to prevent a disadvantage caused by adhesion of a foreign material onto the surface of the glass coat film, as can be done in the embodiment 2.

(Embodiment 6)

Figure 10:
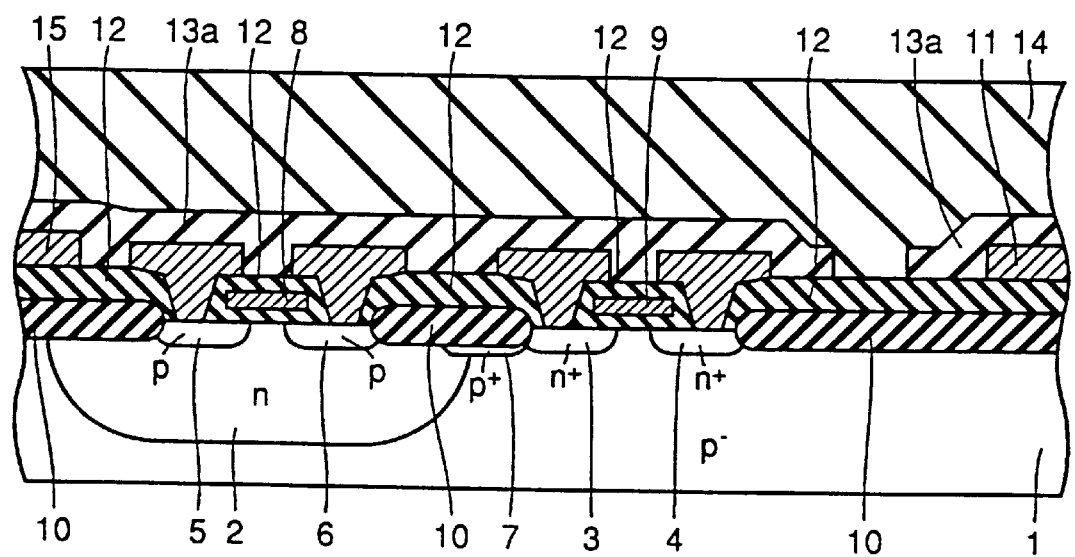
FIG. 10 is a cross section showing an IC having a high breakdown voltage according to an embodiment 6 of the invention.
Figure 11:
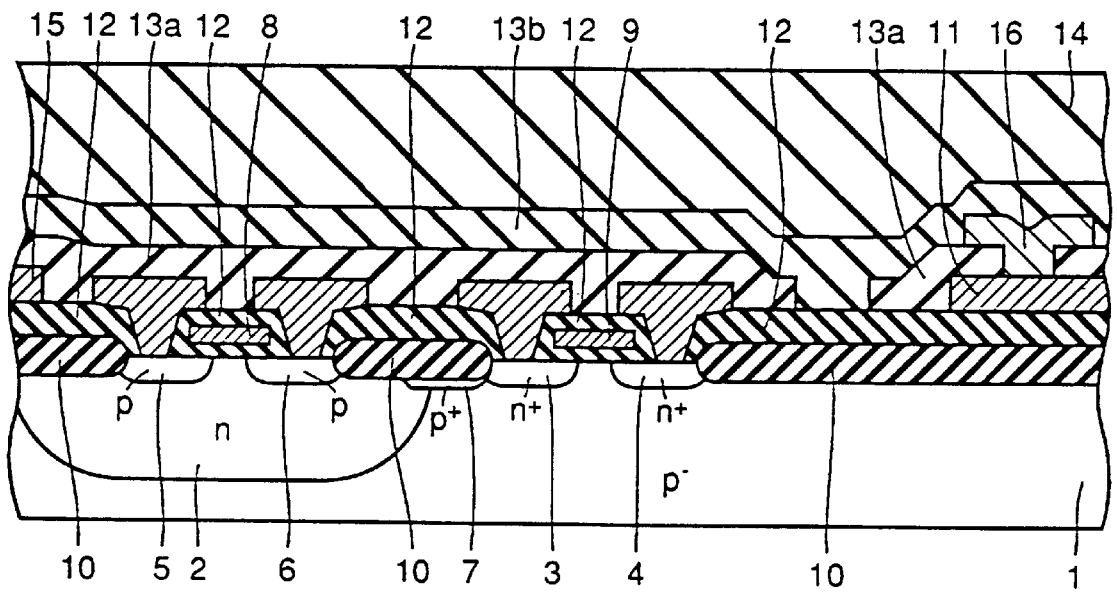
FIG. 11 is a cross section showing an IC having a high breakdown voltage according to a modification of the embodiment 6 of the invention.

A structure of an IC having a high breakdown voltage according to an embodiment 6 will be described below with reference to FIG. 10. The structure of the embodiment 6 is basically the same as that of the embodiment 1 shown in FIG. 1. In this embodiment 6, however, conductive glass coat film 13a has portions, which are isolated from each other and cover different electrodes, i.e., aluminum electrode 11 subjected to a high voltage and another electrode not subjected to a high voltage, respectively. Owing to this structure, it is possible to prevent effectively current leakage between aluminum electrode 11 subjected to a high voltage and a CMOS region not subjected to a high voltage. Patterning for forming isolated regions of glass coat film 13a does not complicate the manufacturing process, because this patterning can be performed simultaneously with the patterning of glass coat film 13a, e.g., on the bonding pad portion. This isolation structure of glass coat film 13a of the embodiment 6 can be applied to the structures of the embodiments 2 and 3 including multi-layered glass coat films 13a and 13b. FIG. 11 shows an example of a structure in which the embodiment 6 is applied to the structure including multi-layered glass coat films 13a and 13b and formed by the two-layer aluminum process. High-resistance glass coat film 13b is in contact with an upper surface of conductive glass coat film 13a, and fills a region which isolates portions of conductive glass coat film 13a from each other. The conductive glass coat film 13a is provided with a contact hole located above the upper surface of aluminum interconnection 11. Aluminum interconnection 16 at the second level is in contact with aluminum interconnection 11 through this contact hole. Conventional glass coat film 13b covers second aluminum interconnection 16. Since the structure shown in FIG. 11 uses conductive glass coat film 13a as an interlayer film, portions of glass coat film 13a can be isolated simultaneously with formation of the contact hole in glass coat film 13a, so that increase in number of the manufacturing steps can be prevented. Since the isolated region of glass coat film 13a is covered by conventional high-resistance glass coat film 13b, it is possible to prevent an adverse effect due to existence of a region at which the glass coat film is partially eliminated.

(Embodiment 7)

Figure 12:
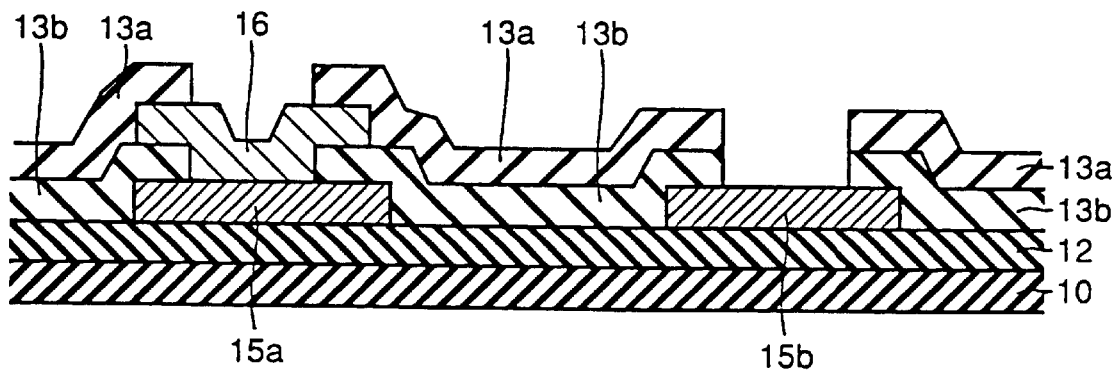
FIG. 12 is a cross section showing an IC having a high breakdown voltage according to an embodiment 7 of the invention.
Figure 13:
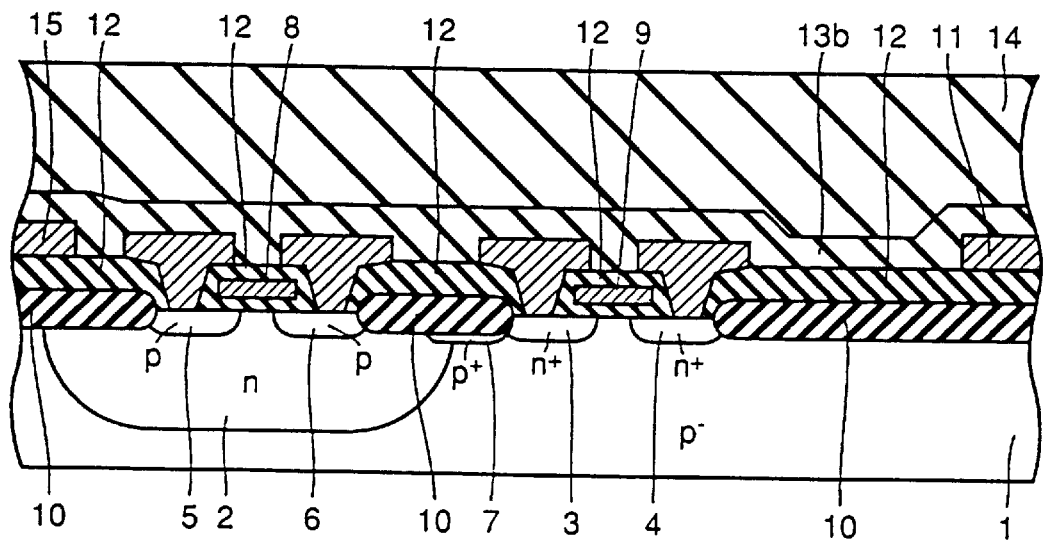
FIG. 13 is a cross section showing an IC having a high breakdown voltage in the prior art.
Figure 14:
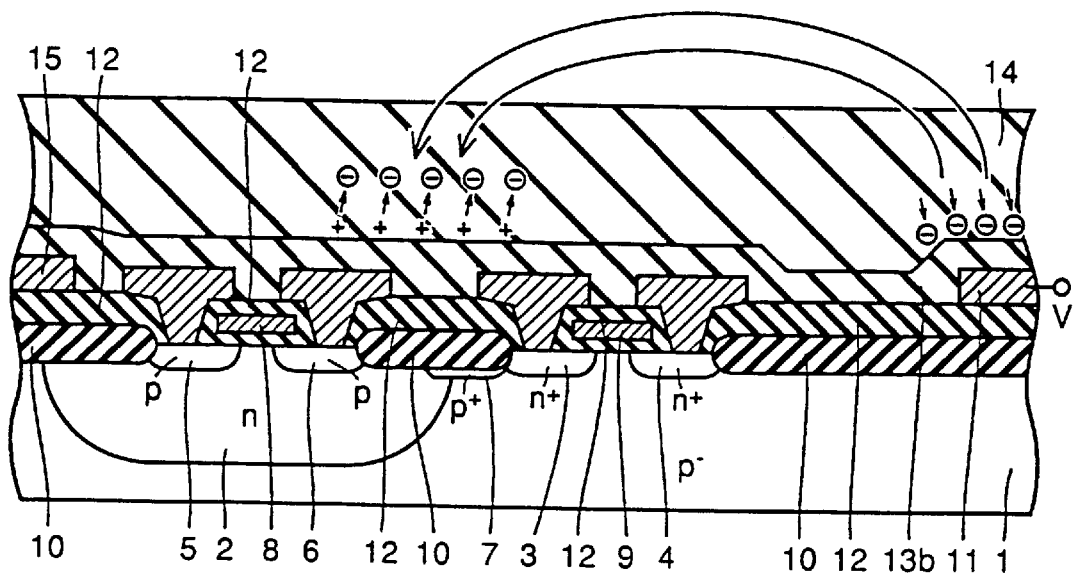
FIG. 14 is a cross section showing a state of an electric field applied to the conventional IC having a high breakdown voltage shown in FIG. 13.
Figure 15:
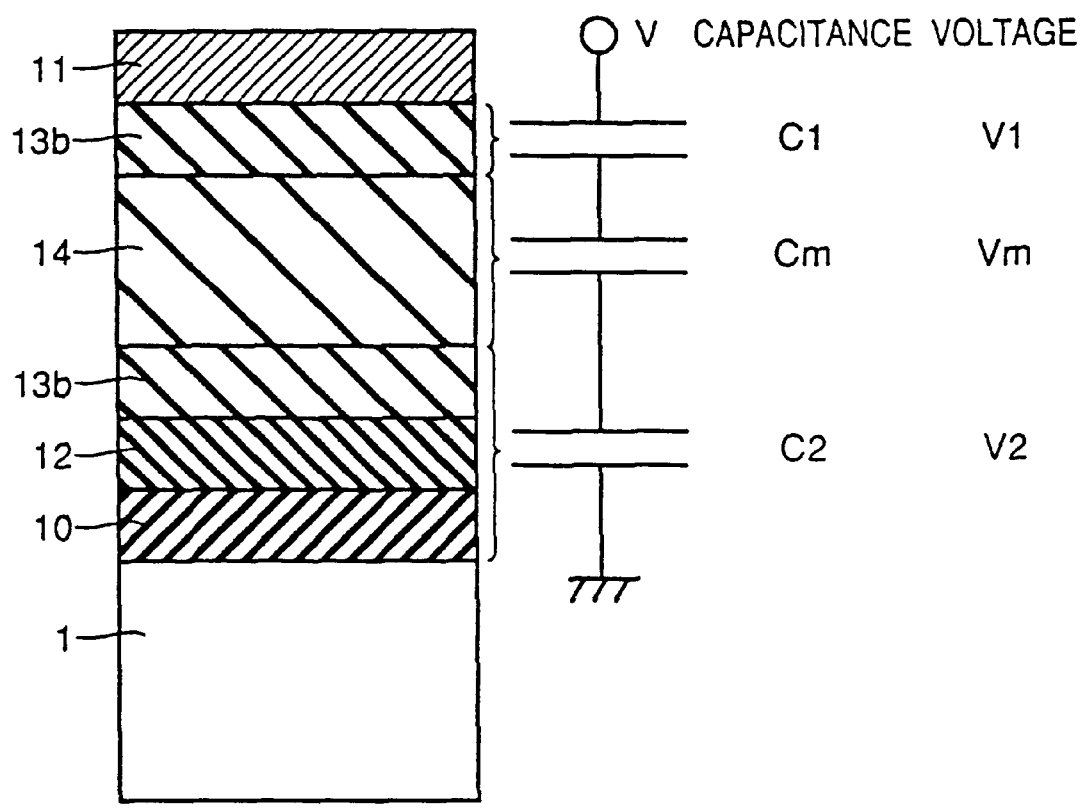
FIG. 15 schematically shows an equivalent capacitor model in the structure shown in FIG. 13.

A structure of an embodiment 7 will be described below with reference to FIG. 12. In the structure of the embodiment 7, the structure of the embodiment 5 in FIG. 9 is applied to the structure of the bonding pad portion. As shown in FIG. 12, aluminum interconnections 15a and 15b spaced by a predetermined distance are formed on passivation film 12 on field oxide film 10. Conventional high-resistance glass coat film 13b covers passivation film 12 and aluminum interconnections 15a and 15b. Glass coat film 13b is provided with contact holes located above aluminum interconnections 15a and 15b, respectively. Second aluminum interconnection 16 fills the contact hole above aluminum interconnection 15a. Conductive glass coat film 13a is formed on glass coat film 13b and second aluminum interconnection 16. Conductive glass coat film 13a is provided with contact holes located above second aluminum interconnection 16 and aluminum interconnection 15b. Since the contact holes at the glass coat films 13a and 13b located above aluminum interconnection 15b have the same size, glass coat film 13a is not in contact with aluminum interconnection 15b. In other words, glass coat film 13a is in contact with only second aluminum interconnection 16. More specifically, by employing the bonding pad which has a configuration similar to the aluminum interconnection 15b formed of only one layer, aluminum interconnection 15b can be formed without making a contact with glass coat film 13a. Thereby, the bonding pad which is in contact with glass coat film 13a and the bonding pad which is not in contact with the same can be formed simultaneously. A conventional glass coat film (not shown) having a high resistance may be formed over conductive glass coat film 13a, whereby it is possible to prevent a disadvantage caused by adhesion of a foreign material onto the surface of the glass coat film, as can be done in the embodiment 2.

According to the invention, as described above, current leakage due to polarization of the mold resin can be effectively prevented owing to employment of the conductive glass coat film having a predetermined conductivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor region having a main surface;

a semiconductor element formed at the main surface of said semiconductor region;

a passivation film covering said semiconductor element; and an over coat formed on said passivation film having an electrical conductivity in a range defined by the following formula (1):

$$\text{conductivity} \geq 1 \times 10^{-10}/E \qquad (1)$$

(E: an electric field intensity [V/cm], $E \geq 2 \times 10^4$ [V/cm]).

2. The semiconductor device according to claim 1, wherein said mold resin is formed in contact with an upper surface of said first glass coat film.

3. The semiconductor device according to claim 1, wherein said glass coat film further includes a second glass coat film formed in contact with a surface of said first glass coat film.

4. The semiconductor device according to claim 3, wherein said second glass coat film is in contact with an upper surface of said first glass coat film.

5. The semiconductor device according to claim 1, wherein said first glass coat film includes a first portion covering an electrode subjected to a high voltage and a second portion covering an electrode not subjected to a high voltage, and said first and second portions are isolated from each other.

6. The semiconductor device according to claim 5, wherein
said glass coat film includes a second glass coat film formed in contact with an upper surface of said first glass coat film, and covering a region isolating said first glass coat film.

7. The semiconductor device according to claim 3, further comprising:
a first interconnection layer formed on said semiconductor substrate, wherein
said second glass coat film is formed on said first interconnection layer and said semiconductor element, and
said first glass coat film is formed in contact with an upper surface of said second glass coat film and an upper surface of said first interconnection layer.

8. The semiconductor device according to claim 7, wherein
said second glass coat film has a first opening located above the upper surface of said first interconnection layer, and said first glass coat film is in contact with the upper surface of said first interconnection layer through said first opening and has a second opening smaller than said first opening.

9. The semiconductor device according to claim 3, further comprising:
a first interconnection layer formed on said semiconductor region, and a second interconnection layer being in contact with an upper surface of said first interconnection layer, wherein
said second glass coat film is formed on said first interconnection layer and said semiconductor element, and has a first opening located above an upper surface of said first interconnection layer,
said second interconnection layer is in contact with said first interconnection layer through said first opening, and fills said first opening, and
said first glass coat film is formed in contact with an upper surface of said second glass coat film and an upper surface of said second interconnection layer.

10. The semiconductor device according to claim 9, further comprising a third interconnection layer formed from the same layer as said first interconnection layer, wherein said first glass coat film is provided with a second opening reaching said second interconnection layer, and
said first and second glass coat films are provided with a third opening located above said third interconnection layer, and said first glass coat film is not in contact with said third interconnection layer.

11. A semiconductor device comprising:
a semiconductor region having a main surface;
a semiconductor element formed at the main surface of said semiconductor region;
a passivation film covering said semiconductor element; and
an over coat formed on said passivation film, wherein;
said passivation film includes a film having a refractivity of 2.05 or more.

12. A semiconductor device comprising:
a semiconductor region having a main surface;
an element isolating and insulating film formed at the main surface of said semiconductor region;
a pair of source/drain regions formed at regions in the main surface of said semiconductor region adjacent to said element isolating and insulating film, and spaced from each other to define a channel region therebetween;
a gate electrode formed on said channel region with a gate insulating film therebetween;
an impurity region formed under said element isolating and insulating film, and having the same conductivity type as said source/drain regions;
a passivation film covering said gate electrode and said element isolating and insulating film; and
an over coat formed on said passivation film, wherein;
said passivation film includes a first passivation film having an electrical conductivity in a range defined by the following formula (1):

$$\text{conductivity} \geq 1 \times 10^{-10}/E \quad (1)$$

(E: an electric field intensity [V/cm], $E \geq 2 \times 10^4$ [V/cm]).

* * * * *